United States Patent
Richter et al.

(10) Patent No.: US 9,972,634 B2
(45) Date of Patent: May 15, 2018

(54) SEMICONDUCTOR DEVICE COMPRISING A FLOATING GATE FLASH MEMORY DEVICE

(71) Applicant: GLOBALFOUNDRIES Inc., Grand Cayman (KY)

(72) Inventors: Ralf Richter, Radebeul (DE); Peter Krottenthaler, Dresden (DE); Martin Mazur, Pulsnitz (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/234,066

(22) Filed: Aug. 11, 2016

(65) Prior Publication Data

US 2018/0047738 A1    Feb. 15, 2018

(51) Int. Cl.
| | |
|---|---|
| *H01L 27/115* | (2017.01) |
| *H01L 27/11546* | (2017.01) |
| *H01L 27/12* | (2006.01) |
| *H01L 27/11521* | (2017.01) |
| *H01L 29/78* | (2006.01) |
| *H01L 29/788* | (2006.01) |
| *H01L 29/423* | (2006.01) |
| *H01L 29/161* | (2006.01) |
| *H01L 29/10* | (2006.01) |

(52) U.S. Cl.
CPC .. *H01L 27/11546* (2013.01); *H01L 27/11521* (2013.01); *H01L 27/1207* (2013.01); *H01L 29/1054* (2013.01); *H01L 29/161* (2013.01); *H01L 29/42328* (2013.01); *H01L 29/7838* (2013.01); *H01L 29/7881* (2013.01)

(58) Field of Classification Search
CPC ..... H01L 27/11526–27/11548; H01L 29/7841; H01L 29/788; H01L 27/10897; H01L 29/4234
See application file for complete search history.

(56) References Cited

U.S. PATENT DOCUMENTS

| | | | |
|---|---|---|---|
| 2010/0052034 A1* | 3/2010 | Cheng | H01L 29/66825 257/316 |
| 2014/0312423 A1* | 10/2014 | Cheng | H01L 21/823807 257/351 |
| 2016/0163876 A1* | 6/2016 | Wu | H01L 29/66825 257/320 |
| 2016/0211250 A1* | 7/2016 | Langheinrich | H01L 27/11534 |

* cited by examiner

*Primary Examiner* — Julia Slutsker
(74) *Attorney, Agent, or Firm* — Amerson Law Firm, PLLC

(57) ABSTRACT

A method of manufacturing a semiconductor device is provided including providing a silicon-on-insulator (SOI) substrate comprising a semiconductor bulk substrate, a buried insulation layer formed on the semiconductor bulk substrate and a semiconductor layer formed on the buried insulation layer, forming a first transistor device on and in the SOI substrate in a logic area of the SOI substrate, removing the semiconductor layer and the buried insulation layer from a memory area of the SOI substrate, forming a dielectric layer on the exposed semiconductor bulk substrate, forming a floating gate layer on the first dielectric layer, forming an insulating layer on the floating gate layer and forming a control gate layer on the insulating layer, wherein an upper surface of the floating gate layer is substantially at the same height level as an upper surface of the semiconductor layer remaining in the logic area.

20 Claims, 9 Drawing Sheets

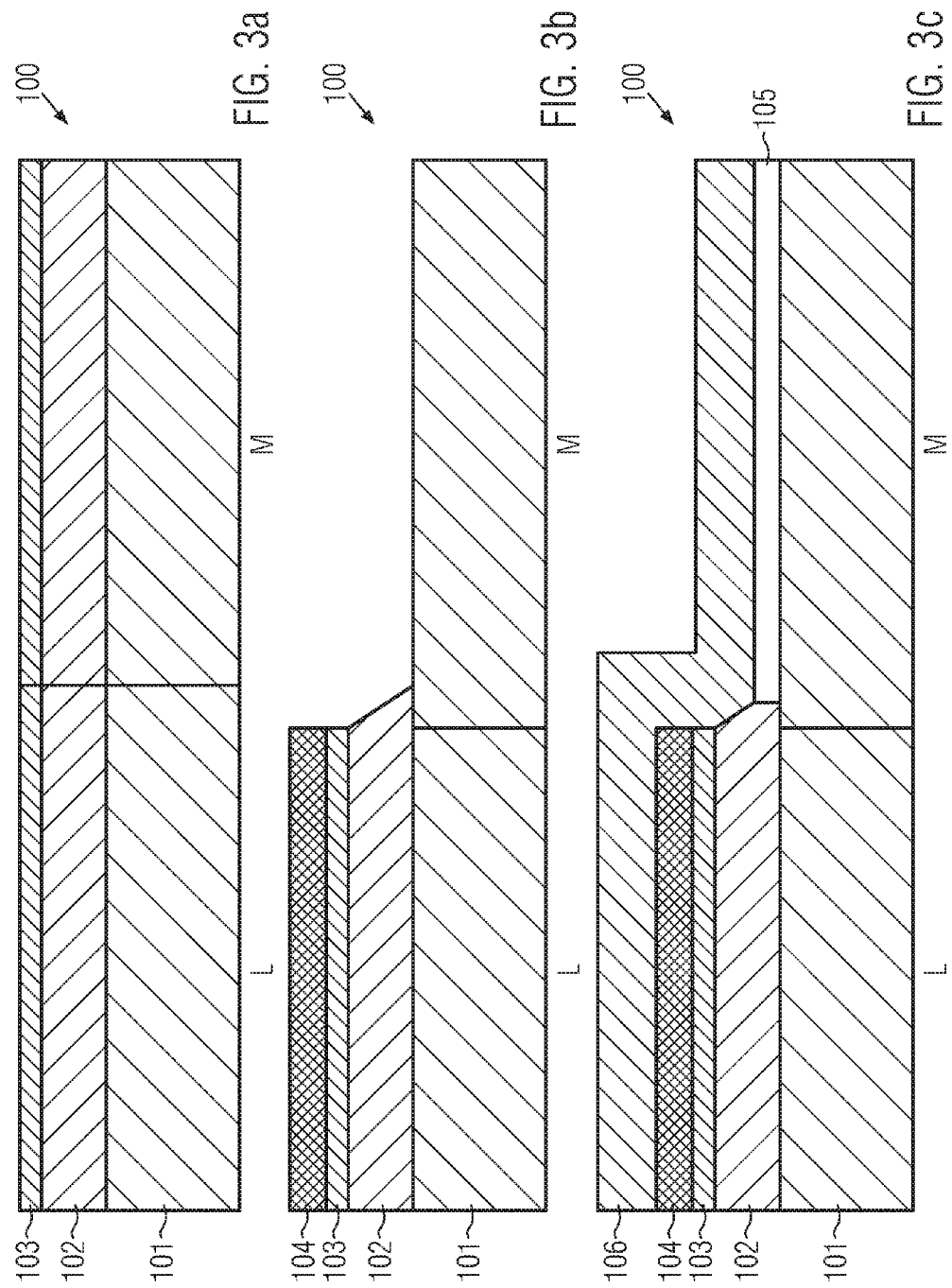

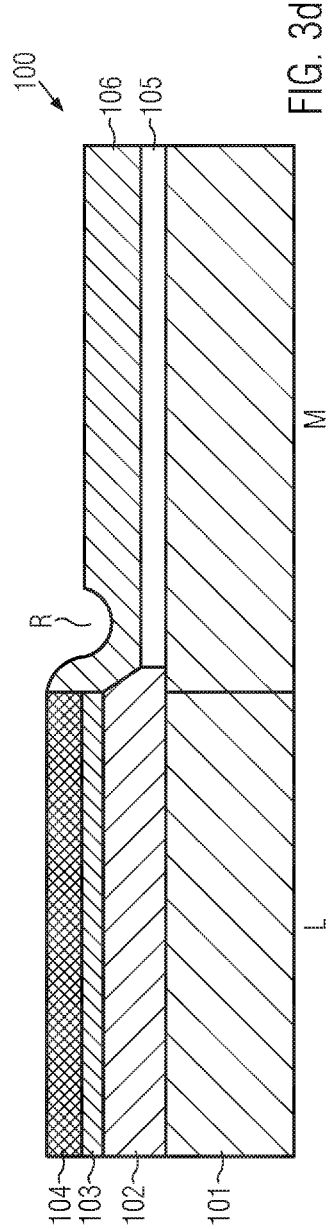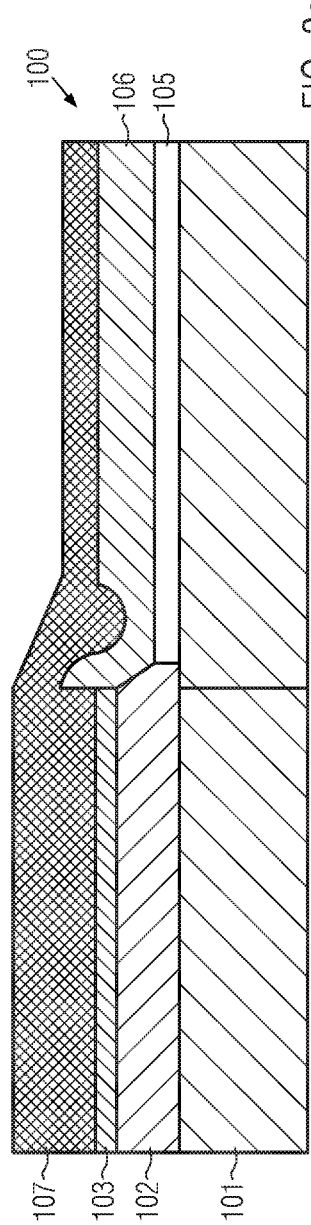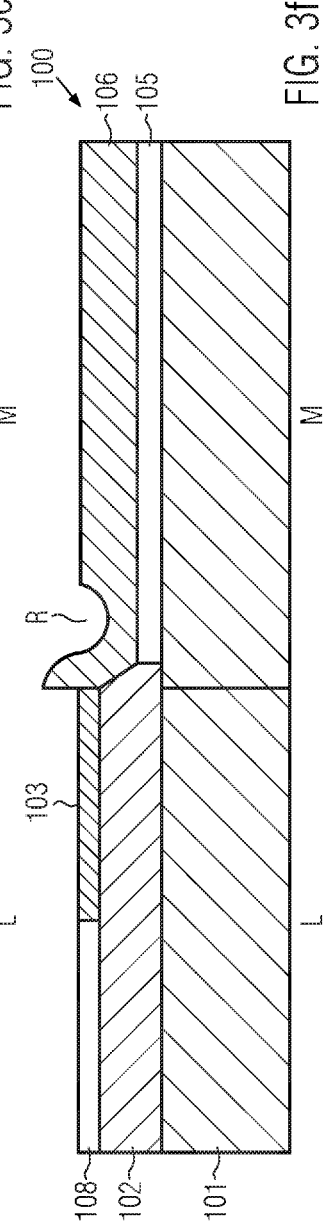

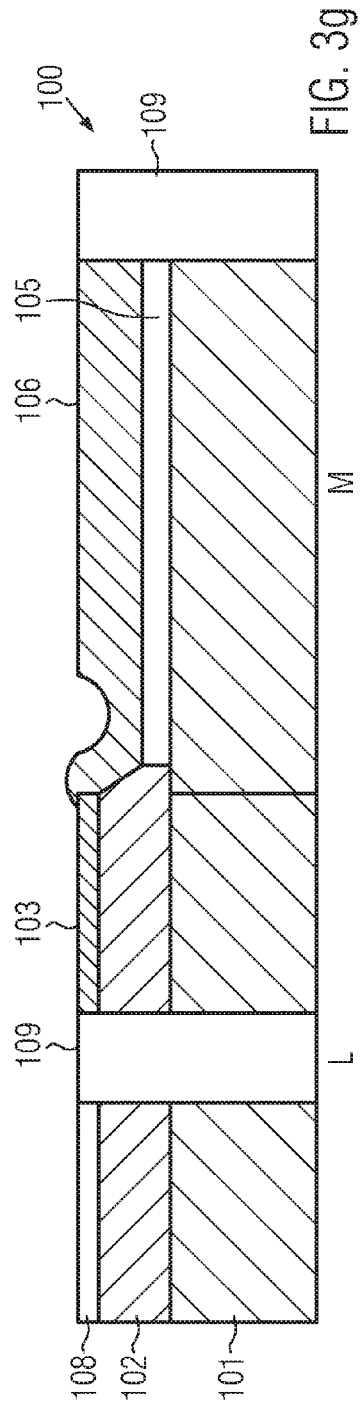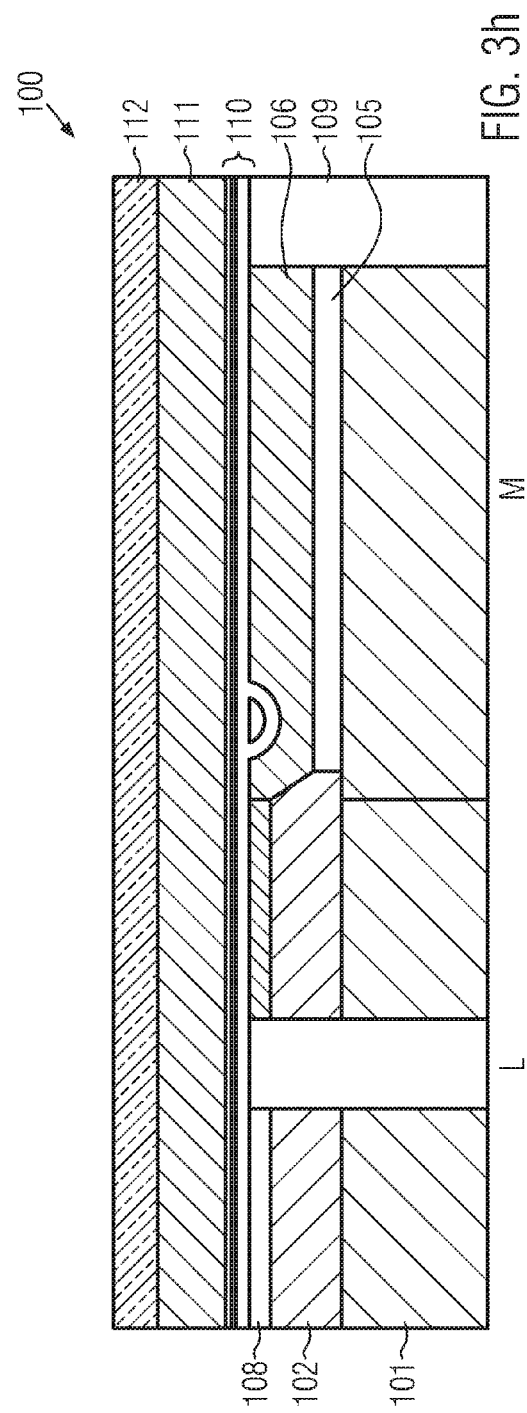

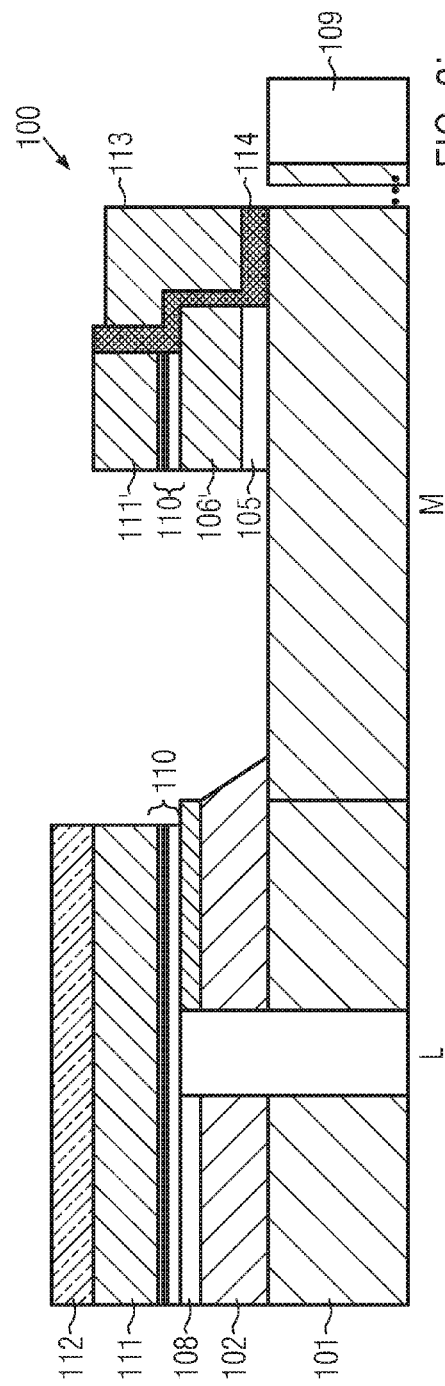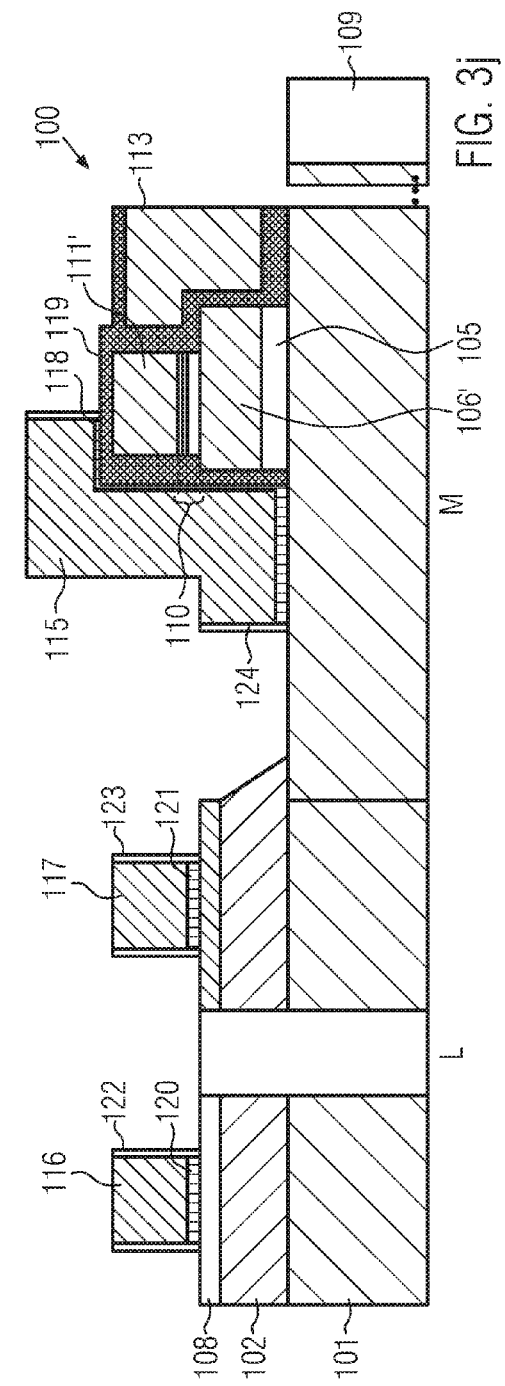

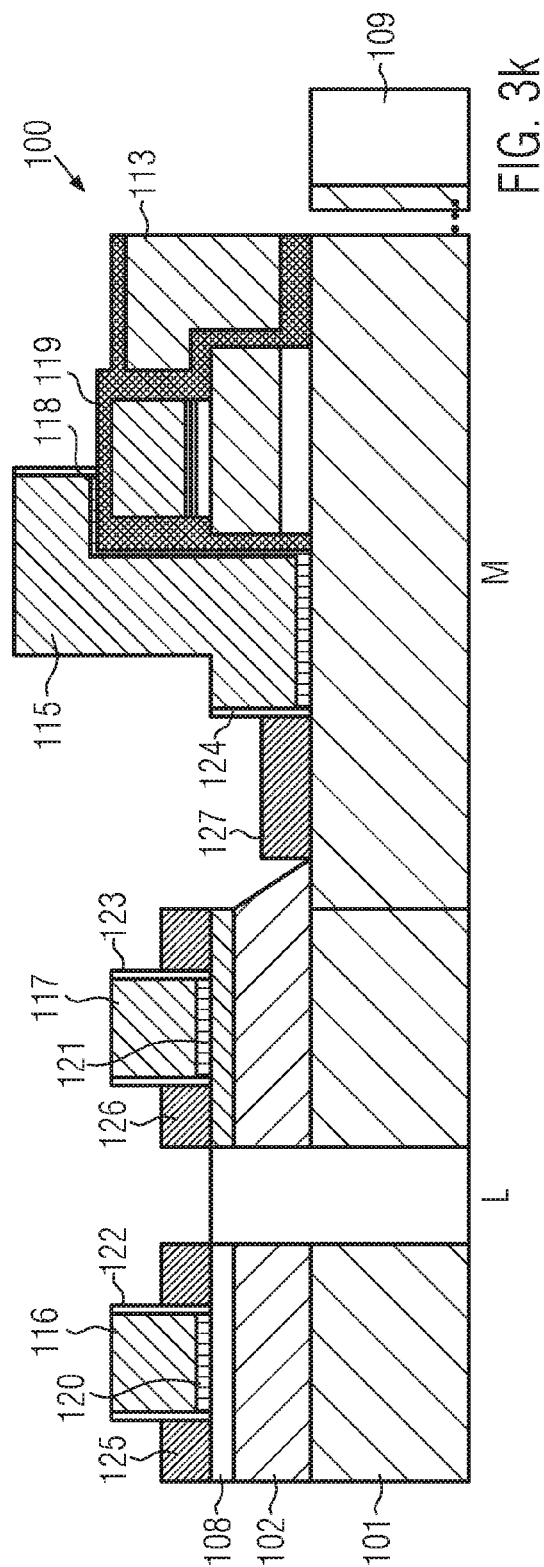

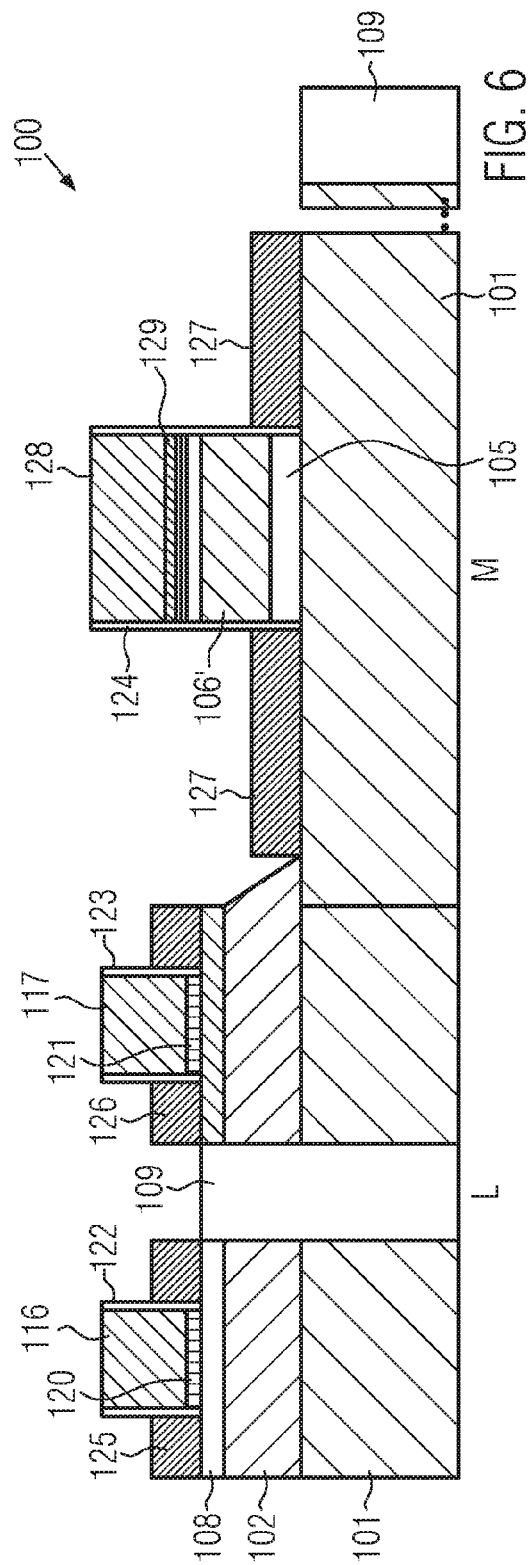

SEMICONDUCTOR DEVICE COMPRISING A FLOATING GATE FLASH MEMORY DEVICE

BACKGROUND OF THE INVENTION

1. Field of the Invention

Generally, the present disclosure relates to the field of integrated circuits and semiconductor devices and, particularly, the manufacture of flash memory devices, and, more particularly, the manufacture of flash memory devices integrated in the process flow of manufacturing transistor devices.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer. Moreover, in many applications, flash memory devices comprising transistor devices are needed.

A flash memory (for example, a FLASH EPROM or FLASH EEPROM) is a semiconductor device that is formed from an array of memory cells (devices) with each cell having a floating gate transistor. Flash memory chips fall into two main categories, namely, those having a so-called "NOR" architecture and those having a so-called "NAND" architecture. Data can be written to each cell within the array, but the data is erased in blocks of cells. Each floating gate transistor comprises a source, drain, floating gate and control gate. The floating gate uses channel hot electrons for writing from the drain and tunneling for erasure from the source. The sources of each floating gate in each cell in a row of the array are connected to form a source line. In embedded memory solutions, memory cells are provided in the neighborhood of logic devices and are, particularly, together with the logic devices on a single (monolithic) silicon substrate. Flash memory devices are used in many applications, including handheld computing devices, wireless telephones and digital cameras, as well as automotive applications. To enable the individual memory elements of a flash memory chip to maintain the physical state with which they have been programmed, each memory region must be isolated from its neighboring regions, typically by shallow trench isolations.

A variety of single gate and split gate solutions for embedded memory cell architectures are known in the art. FIG. 1 illustrates, for exemplary purposes, an embedded super flash cell of the prior art. The cell is formed on a semiconductor substrate 11 wherein source/drain regions 12 are formed. The cell comprises a floating gate 13, a control gate 14, an erase gate 15 and a select gate 16 formed by a word line. All of the gates may be made of polysilicon and they are covered by a multilayer insulation structure 17. The multilayer insulation structure 17 comprises parts of spacer structures formed on the tops and sidewalls of the gates. The floating gate 13 is formed over a floating gate oxide layer 18 and it is separated from the erase gate 15 by a tunnel oxide layer 18a that may be formed of the same material as the floating gate oxide layer 18. The control gate 14 and the floating gate 13 are separated from each other by an isolation layer 19, for example, an oxide-nitride-oxide (ONO) layer provided in order to enhance the capacitive coupling between the floating gate 13 and the control gate 14.

However, whereas flash cell integration in the context of manufacturing of field effect transistors (FETs) with silicon-oxynitride gate dielectrics can be reliably achieved, integration of flash cells in CMOS technologies used for the formation of FETs (and, for example, comprising the formation of high-k metal gate transistor devices) still poses challenging problems. Particularly, in the context of Fully Depleted Silicon-On-Insulator (FDSOI) Complementary Metal-Oxide-Semiconductor (CMOS) manufacturing techniques, co-integration of non-volatile memory cells as flash memory cells requires many additional deposition and masking steps.

FIG. 2 shows a typical semiconductor device comprising a bulk transistor device 40 and an FDSOI transistor device 50. The bulk transistor device 40 and the FDSOI transistor device 50 are isolated from each other by an isolation region 60. The bulk transistor device 40 is formed on a semiconductor bulk substrate 41 that provides a channel region in a top region. The bulk transistor device 40 comprises a polysilicon gate electrode layer 42, a metal gate electrode layer 43, a work function adjusting layer 44 and a gate dielectric layer 45 that, for example, is a high-k dielectric layer. Furthermore, the bulk transistor device 40 comprises sidewall spacers 46 and raised source/drain regions 47.

The FDSOI transistor device 50 is formed on an SOI substrate that comprises a semiconductor bulk substrate 51, a buried oxide layer 52 formed on the semiconductor bulk substrate 51 and a semiconductor layer 53 that provides a channel region of the FDSOI transistor device 50. Further, the FDSOI transistor device 50 comprises a polysilicon gate electrode layer 54, a metal gate electrode layer 55, a work function adjusting layer 56 and a gate dielectric layer 57 that, for example, is a high-k dielectric layer. A sidewall spacer 58 is formed at the sidewalls of the above-mentioned layers and raised source/drain regions 59 are formed by epitaxy on the surface of the semiconductor layer 53. The process flow of manufacturing the semiconductor device shown in FIG. 2 may be optimized with respect to the number of mask layers, etching processes, implantation processes, etc. However, in the art, the integration of the manufacture of flash memory devices in that process flow requires additional deposition and masking steps, thereby significantly increasing the complexity of the overall processing and manufacturing costs.

In view of the situation described above, the present disclosure provides a technique of forming a semiconductor device comprising a flash memory device integrated within (FD)SOI technologies with a reduced number of processing steps as compared to the art. In addition, a semiconductor device comprising a flash memory device formed according to a method of manufacturing in accordance with the present disclosure is provided.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to the manufacturing of a semiconductor device, for example, an FDSOI semiconductor device, comprising a memory device, in particular, a non-volatile flash memory device. Using the illustrative manufacturing techniques disclosed herein, the formation of the memory device can be integrated in a process flow of FDSOI FET manufacturing.

One illustrative method of manufacturing a semiconductor device is disclosed that may include, among other things, providing a silicon-on-insulator (SOI) substrate comprising a semiconductor bulk substrate, a buried insulation layer formed on the semiconductor bulk substrate and a semiconductor layer formed on the buried insulation layer, forming a first transistor device on and in the SOI substrate in a logic area of the SOI substrate, removing the semiconductor layer and the buried insulation layer from a memory area of the SOI substrate, thereby exposing the semiconductor bulk substrate in the memory area, forming a dielectric layer on the exposed semiconductor bulk substrate, forming a floating gate layer on the first dielectric layer, forming an insulating layer on the floating gate layer and forming a control gate layer on the insulating layer, wherein an upper surface of the floating gate layer is substantially at the same height level as an upper surface of the semiconductor layer remaining in the logic area. Thereby, an integrated process for forming (FDSOI) transistor devices and flash memory cells is provided.

Another illustrative method disclosed herein for manufacturing a semiconductor device may include, among other things, forming an N-channel transistor device in a logic area of a silicon-on-insulator (SOI) substrate comprising a semiconductor bulk substrate, a buried insulation layer formed on the semiconductor bulk substrate and a semiconductor layer formed on the buried insulation layer, wherein the semiconductor layer provides for a channel region of the N-channel transistor device, forming an SiGe region in the semiconductor layer, forming a P-channel transistor device comprising a channel region provided by the SiGe region in the logic area, and forming a flash memory device including forming a floating gate and a control gate over the floating gate in a memory area of the SOI substrate. In this illustrative example, an upper surface of the floating gate layer may be positioned substantially at the same height level as an upper surface of the semiconductor layer remaining in the logic area and at substantially the same height level as an upper surface of the SiGe region.

Furthermore, one illustrative example of a semiconductor device disclosed herein may include, among other things, a silicon-on-insulator (SOI) substrate comprising a semiconductor bulk substrate, a buried insulation layer formed on the semiconductor bulk substrate and a semiconductor layer formed on the buried insulation layer, wherein the semiconductor layer and the buried insulation layer are removed in a memory area of the SOI substrate, a flash memory device comprising a floating gate in the memory area of the SOI substrate comprising a floating gate and a control gate formed over the floating gate, and a transistor device comprising a gate electrode and a channel region formed in the semiconductor layer of the SOI substrate in a logic area of the SOI substrate, wherein an upper surface of the floating gate layer of the flash memory device is substantially at the same height level as an upper surface of the semiconductor layer in the logic area.

BRIEF DESCRIPTION OF THE DRAWINGS

The disclosure may be understood by reference to the following description taken in conjunction with the accompanying drawings, in which like reference numerals identify like elements, and in which:

FIGS. 3a-3k depict one illustrative process flow of manufacturing a flash memory device integrally with forming transistor devices according to an example of the present disclosure;

FIG. 6 shows another alternative configuration of a flash memory device with self-aligned control and floating gates.

Figure 1:
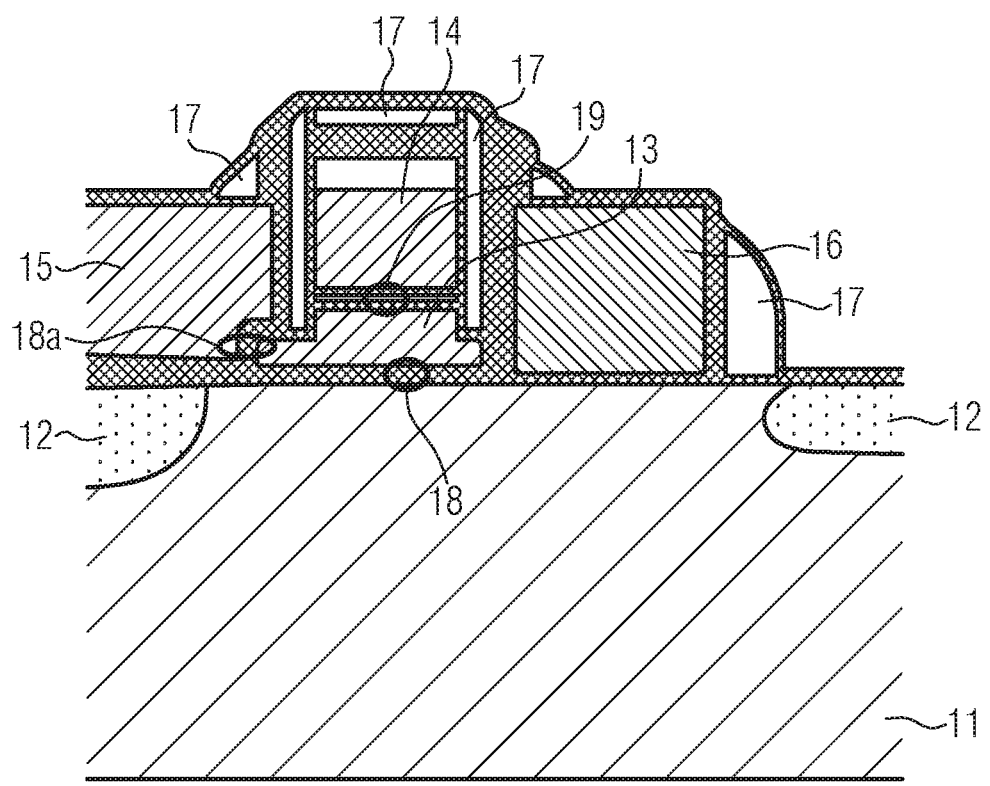
FIG. 1 illustrates a flash memory device of the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of semiconductor devices. These references are intended to be used in a manner consistent with the drawings only for teaching purposes, and are not intended as absolute references for semiconductor device structures. For example, FETs or memory devices may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

Generally, manufacturing techniques and semiconductor devices in which N-channel transistors and/or P-channel transistors and memory cells may be formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices, etc., in principle. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure, generally, provides techniques for the formation of flash memory devices within (FD)SOI processing. In particular, various integrated manufacturing techniques are disclosed herein for manufacturing an integrated circuit product that comprises a flash memory device and a high-k dielectric-metal (-poly) gate FET.

In the following, one illustrative process flow for manufacturing a flash memory device integrated with the manufacture of logic transistor devices is described with reference to FIGS. 3a-3k. FIG. 3a shows an SOI substrate 100 used for the formation of FETs and a flash memory device. The SOI (Semiconductor-On-Insulator) substrate 100 comprises a semiconductor bulk substrate 101, a buried oxide (BOX) or buried insulation layer 102 formed on the semiconductor bulk substrate 101 and a semiconductor layer 103 (sometimes referred to as the active layer) formed on the BOX layer 102. The semiconductor layer 103 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like.

The BOX layer 102 of the SOI substrate may comprise any of a variety of insulating type materials, e.g., silicon (di)oxide or a borosilicate glass or a borophosphosilicate glass (BPSG). The BOX layer 102 may be composed of different layers and one of the different layers may comprise BPSG or an $SiO_2$— compound comprising boron or phosphorus. The semiconductor bulk substrate 101 may comprise or consist of silicon, in particular, single crystal silicon. Other materials may be used to form the semiconductor bulk substrate 101 such as, for example, germanium, silicon germanium, gallium phosphate, gallium arsenide, etc. For example, the thickness of the semiconductor layer 103 may be in the range of 5-20 nm, in particular, 5-10 nm, and the thickness of the BOX layer 102 may be in the range of 10-50 nm, in particular, 10-30 nm and, more particularly, 15-25 nm.

One may define a logic area L and a memory area M of the SOI substrate 100. Logic transistors, in particular FDSOI transistors, are to be formed in the logic area L and a memory device is to be formed in the memory area M using an integrated process flow. Both the BOX layer 102 and the semiconductor layer 103 are removed in the memory area M only by means of a hard mask layer 104, for example, comprising or consisting of SiN, that is formed above the semiconductor layer 103 of the SOI substrate 100 in the logic area L and an appropriate etching process, as shown in FIG. 3b. A gate dielectric (oxide) layer 105, for example, a silicon-oxide layer, is formed on the exposed surface of the semiconductor bulk substrate 101 in the memory area M and a floating gate layer 106 is formed on the gate oxide layer 105 and the hard mask layer 104, as shown in FIG. 3c. In one illustrative embodiment, the floating gate layer 106 may comprise or consist of polysilicon.

Then, the portion of the floating gate layer 106 positioned above the hard mask layer 104 is removed, for example, by chemical mechanical polishing or lithography and etching as known in the art (see FIG. 3d). It is noted that the partial removal of the floating gate layer 106 is performed such that a recess R is formed in the remaining floating gate layer 106 at the edge of the memory area M. A second hard mask layer 107 is formed over the entire structure, as can be seen in FIG. 3e. The second hard mask layer 107 may consist of the same material as the first hard mask layer 104. The second hard mask layer 107 is provided to protect the floating gate layer 106 against SiGe condensation initiated in a next processing step.

In the manufacturing stage shown in FIG. 3f, a compressive silicon-germanium channel (cSiGe) region 108 is formed in a portion of the semiconductor layer 103 of the SOI substrate 100, for example, by local Ge enrichment involving the epitaxial formation of a compressive SiGe layer on the exposed surface of the semiconductor layer 103. For this, the first and second hard mask layers 104 and 107 have to be opened to expose portions of the semiconductor layer 103. After completion of the cSiGe 108 formation, the hard masks 104 and 107 are removed. Note that the edge of the floating gate layer 106 in the vicinity of the logic area L projects above the height level of the semiconductor layer 103 and the cSiGe region 108. The upper surface of the main portion of the floating gate layer 106 (to the right of the recess R in FIG. 3f) has substantially (for example, within a tolerance of +15 nm to −15 nm) the same height level as the upper surfaces of the semiconductor layer 103 and the cSiG region 108.

In the manufacturing stage shown in FIG. 3g, isolation regions 109, for example, shallow trench isolations (STI), are formed both in the logic area L and the memory area M in order to electrically isolate devices to be formed in these areas. After completion of the formation of the isolation regions 109, a multilayer insulating layer 110 is formed over the entire structure, as shown in FIG. 3h. The insulating layer 110 may comprise or consist of an oxide-nitride-oxide (ONO) layer. As shown in FIG. 3h, a control gate layer 111 is formed on the insulating layer 110 and another hard mask layer 112 is formed on the control gate layer 111. In one illustrative embodiment, the control gate layer 111 may comprise or consist of polysilicon. The hard mask layer 112 may be made of an oxide material and after patterning is used as an etching mask. FIG. 3i shows a configuration obtained by the etching and after removal of the hard mask layer 112 from the memory area M. The etching results in the formation of a control gate 111' and a floating gate 106'. Moreover, in the manufacturing stage shown in FIG. 3i, an erase gate 113 has been formed that is separated from the control gate 111' and the semiconductor bulk substrate 101 by a gate oxide layer 114 that may comprise or consist of a silicon oxide material. The gate oxide layer 114 is formed over sidewalls of the control gate 111' and the floating gate 106' after etching of the control gate layer 111 and the floating gate layer 106. Moreover, the gate oxide layer 114 is formed over sidewalls of the etched insulating layer 110 and the etched gate oxide layer 105 (see also FIG. 3h). Formation of the gate oxide layer 114 can be achieved by conventional depositing, masking and etching steps. As shown in FIG. 3i, the insulation region 109 in the memory area M is also etched back. The three dots and the gap in the semiconductor bulk substrate 101 indicate that the insulation region 109 may be more distant from the resulting flash memory device than it is shown. As can, furthermore, be seen in FIG. 3i, the upper surface of the floating gate 106' is substantially (for example, within a tolerance of +15 nm to −15 nm) at the same height level as the upper surfaces of the semiconductor layer 103 and the cSiGe region 108.

In the manufacturing stage shown in FIG. 3j, a select gate 115 partially overlapping the control gate 111' has been formed in the memory area. Furthermore, a gate electrode 116 of a P-channel FET is formed over the cSiGe region 108 and a gate electrode 117 of an N-channel FET is formed over the semiconductor layer 103 in the logic area L. The select gate 115 is separated from the semiconductor bulk substrate 101 by a gate dielectric (oxide) layer 118. Moreover, the select gate 115 is separated from the gate dielectric layer 105, the floating gate 106', the insulating layer 110 and the control gate 111' by the gate dielectric layer 118 and an additional oxide layer 119 that may be formed of the same material as the oxide layer 114. The additional oxide layer 119 is also formed on an upper surface of the erase gate 113. A gate dielectric layer 120 is formed between the gate electrode 116 of the P-channel FET and the cSiGe region 108 and a gate dielectric layer 121 is formed between the gate electrode 117 of the N-channel FET and the semiconductor layer 103. The gate electrode 116 of the P-channel FET, the gate electrode 117 of the N-channel FET and the select gate 115 may comprise or consist of the same material, such as polysilicon. In addition, each of the gate electrode 116 of the P-channel FET, the gate electrode 117 of the N-channel FET and the select gate 115 may comprise a metal gate layer. The metal gate layer, for example, comprises a plurality of layers that may include Al, AlN or TiN. In particular, the metal gate layer may comprise a work function adjusting material that comprises an appropriate transition metal nitride, for example, those from groups 4-6 in the periodic table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm, i.e., the work function adjusting layer may be integrated in the metal gate layer.

The gate dielectrics 120, 121 of the N-channel transistor and the P-channel transistor, respectively, and the gate electrodes 116, 117 of the same are formed after removal of the hard mask layer 112, the floating gate layer 111 and the insulating layer 110 from the logic area L and may be performed by standard FDSOI processing steps including poly (gate) patterning. In particular, the select gate 115 may be formed during the same processing step used for the formation of the gate electrodes 116, 117 of the N-channel transistor and the P-channel transistor, i.e., formation of the select gate 115 is fully integrated in the manufacturing of FDSOI FETs. This manufacturing may include the formation of sidewall spacers 122 and 123 at sidewalls of the gate electrodes 116, 117 of the N-channel transistor and the P-channel transistor. A sidewall spacer 124 may be formed on sidewalls of the select gate 115 at the same time that the sidewall spacers 122, 123 of the P-channel and N-channel FETs are formed. The sidewall spacers 122, 123 and 124 may include silicon dioxide and/or silicon nitride. The sidewall spacers 122, 123 and 124 may be provided in the form of multilayers by subsequently epitaxially growing or depositing the respective layers on the sidewalls of the gates 115, 116 and 117 and appropriately etching them. Formation of the sidewall spacer 124 may comprise selectively removing the corresponding epitaxially grown (multi)layer from a portion of the surface of the select gate 115.

The above-described process flow may, in one illustrative embodiment, include high-k dielectric FDSOI processing. In one example, the gate dielectrics 120, 121 of the N-channel transistor and the P-channel transistor may be high-k dielectric layers, for example, a dielectric constant k>5, k>10 or k>13, that may comprise a transitional metal oxide, such as at least one of hafnium oxide, hafnium dioxide and hafnium silicon-oxynitride. A work function adjusting layer (not shown in FIG. 3j) may be formed on the high-k dielectric layer and may comprise titanium nitride (TiN) or any other appropriate work function adjusting metal or metal oxide that is known in the art. The gate dielectric layer 118 of the select gate 115 may be formed in the same processing step used for the formation of the gate dielectrics 120, 121 of the N-channel transistor and the P-channel transistor.

Furthermore, as shown in FIG. 3k, raised source/drain regions 125 are formed on cSiGe 108 for the P-channel FET, raised source/drain regions 126 are formed on the surface of the semiconductor layer 103 for the N-channel FET and a source/drain region 127 is formed on the semiconductor bulk substrate 101 for the flash memory device that is formed in the memory area M and includes the floating gate 106', the control gate 111', the erase gate 113 and the select gate 115. The raised source/drain regions 125, 126 and 127 may be formed by epitaxially growing a semiconductor material that may be appropriately doped during the epitaxial growth or after completion of the epitaxial growth process. The raised source/drain regions 125, 126 may be silicided in order to reduce the contact resistance.

Figure 2:
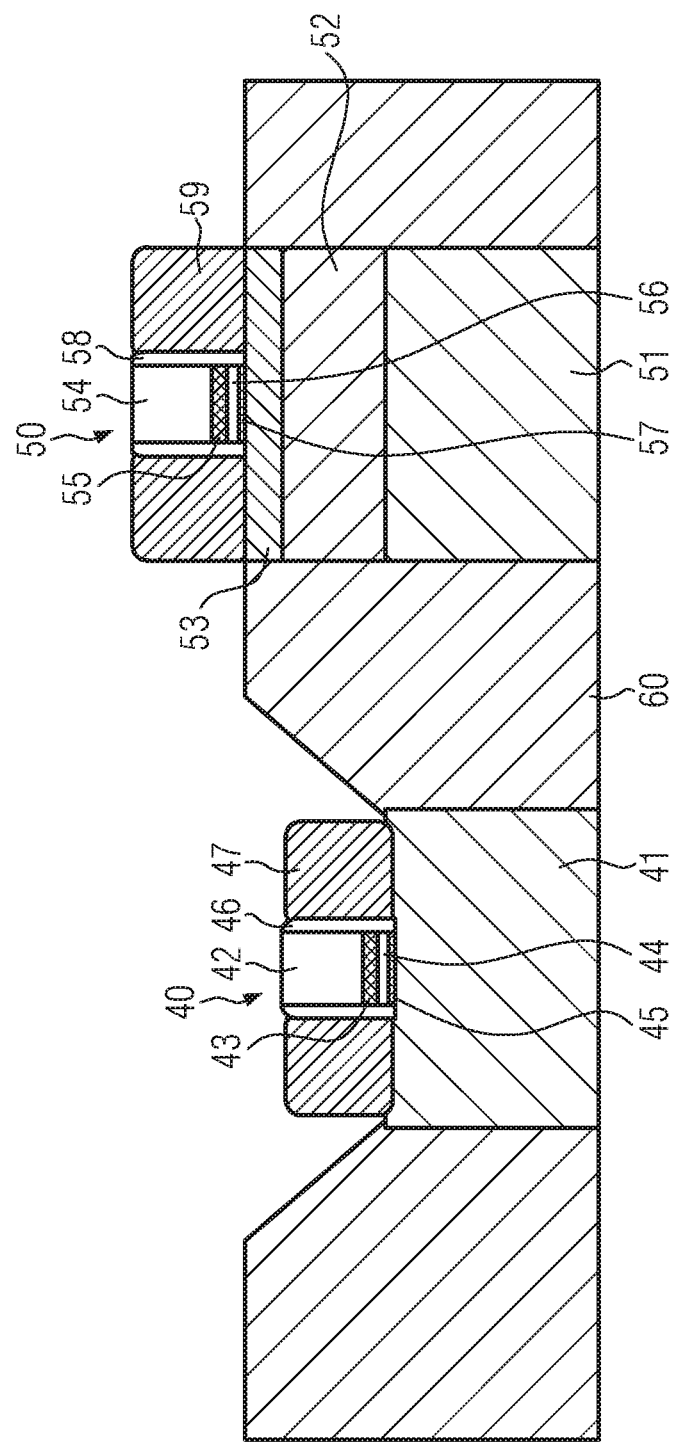
FIG. 2 illustrates an SOI semiconductor device of the prior art that comprises a bulk transistor and an FDSOI transistor.

The above-described manufacturing of a flash memory device may be readily integrated in the process flow of manufacturing FDSOI semiconductor devices (such as, for example, the semiconductor device comprising a bulk transistor and an FDSOI transistor shown in FIG. 2). In particular, the gate electrodes 116, 117 of the P-channel transistor and the N-channel transistor formed in the logic area L and the select gate 115 may be formed in the same process module used for the high-k dielectric/metal(poly) gate manufacturing of (FDSOI) FETs. Further, it is noted that both in the logic area L and the memory area M, back gates may be formed in the semiconductor bulk substrate 101.

With the control gate 111', the select gate 115 and the erase gate 113 surrounding the floating gate 106', the capacitance between the gates is relatively large, and high-voltage coupling between the control gate 111', the select gate 115 and the erase gate 113, on the one hand, and the floating gate 106', on the other hand, is substantially enhanced. That significantly reduces the voltage required for Fowler-Nordheim tunneling, and also makes it possible to use a thicker tunneling oxide (i.e., insulating layer 110) while still maintaining sufficient electron tunneling.

Figure 4:
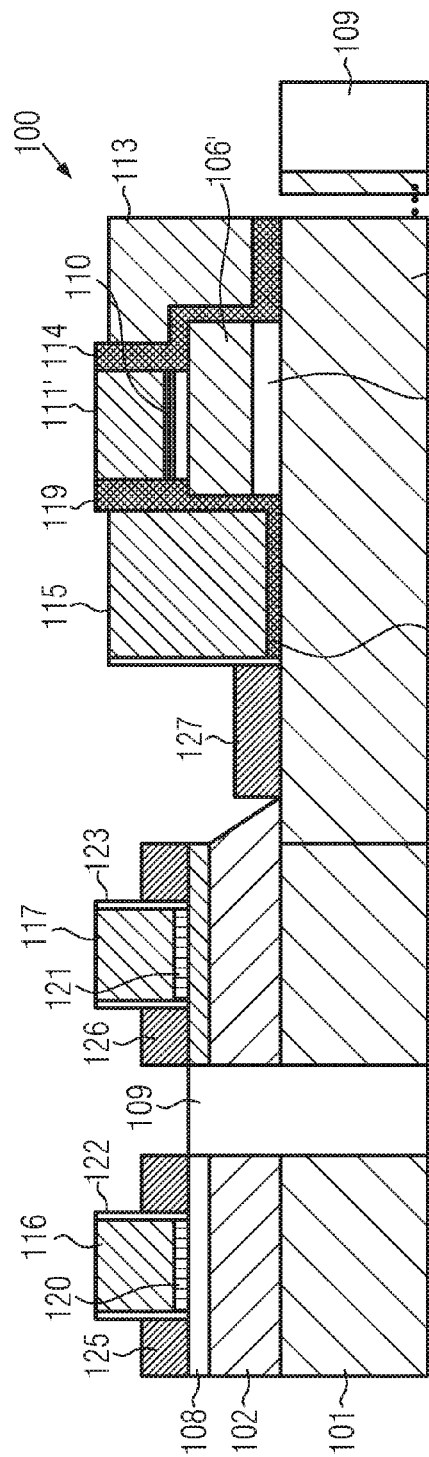
FIG. 4 shows an alternative configuration of a flash memory device with a select gate that does not overlap a control gate.

An alternative embodiment is illustrated in FIG. 4. The semiconductor device shown in FIG. 4 basically differs from the one shown in FIG. 3k by the formation of the select gate 115. In the embodiment shown in FIG. 4, the select gate 115 is not formed at the same time that the gate electrodes 116, 117 of the N-channel transistor and the P-channel transistor are formed. Rather, in this example, the select gate 115 is formed in a separate processing step (module) on an additional dielectric (oxide) layer 128. Since in this embodiment the select gate 115 does not overlap the control gate 111' no oxide layer has to be formed on top of the control gate 111' in order to obtain electrical isolation from the select gate 115.

Figure 5:
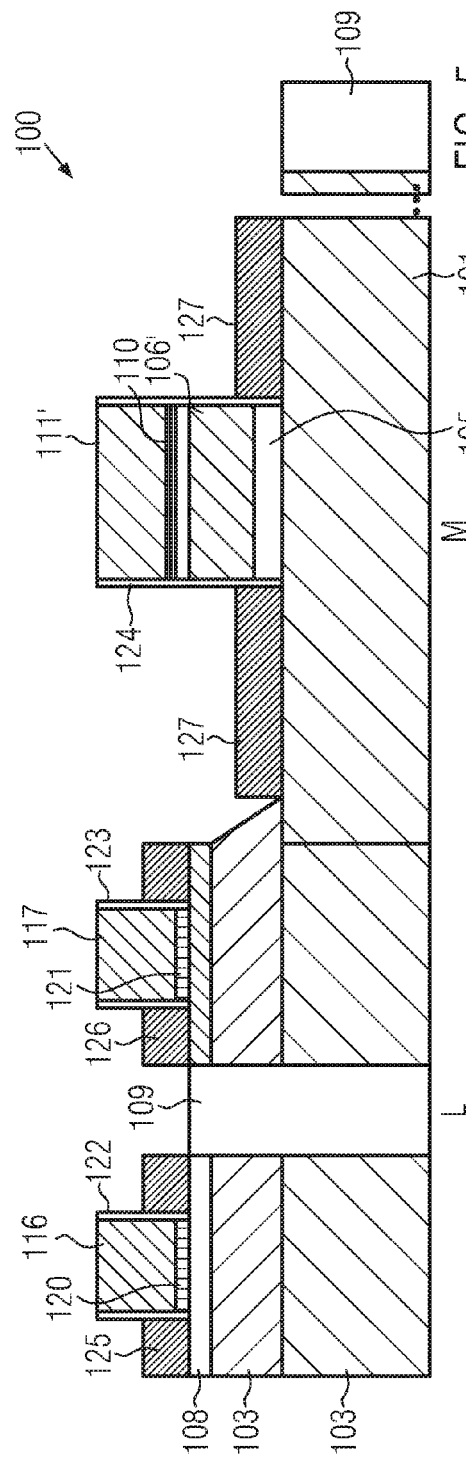
FIG. 5 shows an alternative configuration of a flash memory device with self-aligned control and floating gates.

FIG. 5 shows an alternative configuration of a flash memory device that can be produced according to the disclosed manufacturing techniques. Different from the embodiments illustrated in FIGS. 3k and 4, the control gate 111' and the floating gate 106' are self-aligned to each other and source/drain regions 127 are formed on both sides of the stacked gates 111' and 106'. A sidewall spacer 124 may be formed on sidewalls of the control gate 111' and the floating gate 106' at the same time that the sidewall spacers 122, 123 are formed for the P-channel and N-channel FETs.

FIG. 6 shows yet another alternative configuration of a flash memory device that can be produced according to the disclosed manufacturing techniques. The configuration shown in FIG. 6 basically differs from the one shown in FIG. 5 by the formation of the control gate 130 of the flash memory device. The control gate 130 is not formed from a control gate layer 111 as it was described above. Rather the formation of the control gate 130 may be integrated in the process of FDSOI manufacturing of the P-channel and N-channel FETs in the logic area. In particular, the control gate 130 may be formed on a dielectric layer 129 during the same processing step used for the formation of the gate electrodes 116, 117 of the N-channel transistor and the P-channel transistor, i.e., formation of the control gate 130 is fully integrated in the manufacturing of FDSOI FETs. The control gate 130 may include a metal gate layer as described above. A sidewall spacer 124 may be formed on sidewalls of the control gate 130 and the floating gate 106' at the same time that the sidewall spacers 122, 123 are formed for the P-channel and N-channel FETs.

The above-described process flow may, in one illustrative embodiment, include high-k dielectric FDSOI processing. In this case, the gate dielectrics 120, 121 of the N-channel transistor and the P-channel transistor are high-k dielectric layers, for example, with a dielectric constant k>5, k>10 or k>13, that may comprise a transitional metal oxide, such as at least one of hafnium oxide, hafnium dioxide and hafnium silicon-oxynitride. The gate dielectric layer 129 of the control gate 130 may be formed in the same processing step used for the formation of the gate dielectrics 120, 121 of the N-channel transistor and the P-channel transistor.

As a result, the present disclosure provides various techniques for the integration of the formation of a memory device, in particular, a flash memory device, in the (FD)SOI manufacturing process flow of manufacturing FETs (particularly, high-k metal gate first processing) and it also provides semiconductor devices comprising flash memory devices and FETs. The flash memory device may be part of a NOR or NAND flash memory cell. The (FD)SOI manufacturing of reliably operating semiconductor devices comprising memory cells and logic devices may be significantly improved as compared to the art, since the number of additional deposition and masking steps needed for the formation of the memory device is significantly reduced. The disclosed devices can be suitably produced in the context of advanced 22 nm technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of manufacturing a semiconductor device, the method comprising
    providing a silicon-on-insulator (SOI) substrate comprising a semiconductor bulk substrate, a buried insulation layer formed on said semiconductor bulk substrate and a semiconductor layer formed on said buried insulation layer;
    forming a first transistor device on and in said SOI substrate in a logic area of said SOI substrate;
    forming a first mask layer on said SOI substrate in said logic area;
    removing said semiconductor layer and said buried insulation layer from a memory area of said SOI substrate using said mask layer as an etching mask, thereby exposing said semiconductor bulk substrate in said memory area;
    forming a dielectric layer on said exposed semiconductor bulk substrate;
    forming a floating gate layer on said dielectric layer and on said first mask layer, wherein an upper surface of said floating gate layer in said memory area is substantially at a same height level as an upper surface of said semiconductor layer remaining in said logic area;
forming an insulating layer on said floating gate layer; and
forming a control gate layer on said insulating layer.

2. The method of claim 1, further comprising forming an SiGe region in said semiconductor layer in said logic area and forming a second transistor device in said logic area comprising a channel region formed in said SiGe region.

3. The method of claim 2, wherein said insulating layer and said control gate layer are formed over said SiGe region and said semiconductor layer in said logic area.

4. The method of claim 1, further comprising:
removing said floating gate layer from said first mask layer, thereby exposing an upper surface of said first mask layer;
forming a second mask layer on said exposed upper surface of said first mask layer in said logic area and on said floating gate layer in said memory area;
removing said first and second mask layers from a portion of said semiconductor layer in said logic area; and
forming an SiGe region in another portion of said semiconductor layer.

5. The method of claim 1, further comprising forming a select gate and an erase gate over said semiconductor bulk substrate in said memory area.

6. The method of claim 5, wherein said select gate is formed in a same processing step used for forming a gate electrode of said first transistor.

7. The method of claim 5, further comprising performing a common processing operation to form a first high-k dielectric layer of said first transistor device and to form a second high-k dielectric layer between said select gate and said control gate and said floating gate.

8. A method of manufacturing a semiconductor device, the method comprising:
forming an N-channel transistor device in a logic area of a silicon-on-insulator (SOI) substrate comprising a semiconductor bulk substrate, a buried insulation layer formed on said semiconductor bulk substrate and a semiconductor layer formed on said buried insulation layer, wherein said semiconductor layer provides for a channel region of said N-channel transistor device;
forming an SiGe region in said semiconductor layer;
forming a P-channel transistor device comprising a channel region provided by said SiGe region in said logic area; and
forming a flash memory device comprising forming a floating gate and a control gate over said floating gate in a memory area of said SOI substrate, wherein at least one of said control gate and a select gate of said flash memory device is formed in a same processing step as forming a first gate electrode of said N-channel transistor device and a second gate electrode of said P-channel transistor device, and wherein an upper surface of said floating gate layer is substantially at a same height level as an upper surface of said semiconductor layer remaining in said logic area and substantially at a same height level as an upper surface of said SiGe region.

9. The method of claim 8, wherein:
forming said N-channel transistor device comprises forming a first high-k dielectric layer on said semiconductor layer and forming first gate electrode over said first high-k dielectric layer; and
forming said P-channel transistor device comprises forming a second high-k dielectric layer on said SiGe region and forming said second gate electrode over said second high-k dielectric layer.

10. The method of claim 8, further comprising forming a layer of insulating material over said floating gate and said control gate prior to forming said select gate, wherein at least a portion of said layer of insulating material is positioned between said select gate and said floating gate and between said select gate and said control gate.

11. The method of claim 8, further comprising forming an erase gate over said semiconductor bulk substrate in said memory area.

12. The method of claim 11, further comprising forming a layer of insulating material over said floating gate and said control gate prior to forming said erase gate, wherein at least a portion of said layer of insulating material is positioned between said erase gate and said floating gate and between said erase gate and said control gate.

13. A method of manufacturing a semiconductor device, the method comprising
providing a silicon-on-insulator (SOI) substrate comprising a semiconductor bulk substrate, a buried insulation layer formed on said semiconductor bulk substrate and a semiconductor layer formed on said buried insulation layer;
forming a first transistor device on and in said SOI substrate in a logic area of said SOI substrate;
removing said semiconductor layer and said buried insulation layer from a memory area of said SOI substrate, thereby exposing said semiconductor bulk substrate in said memory area;
forming a dielectric layer on said exposed semiconductor bulk substrate;
forming a floating gate layer on said dielectric layer, wherein an upper surface of said floating gate layer is substantially at a same height level as an upper surface of said semiconductor layer remaining in said logic area;
forming an insulating layer on said floating gate layer;
forming a control gate layer on said insulating layer; and
forming a select gate over said semiconductor bulk substrate in said memory area, wherein said select gate is formed in a same processing step used for forming a first gate electrode of said first transistor.

14. The method of claim 13, wherein forming said first transistor device comprises forming a first high-k dielectric layer on said semiconductor layer and forming said first gate electrode over said first high-k dielectric layer, said first gate electrode comprising a metal gate layer.

15. The method of claim 13, further comprising forming an SiGe region in said semiconductor layer in said logic area and forming a second transistor device in said logic area comprising a channel region formed in said SiGe region.

16. The method of claim 15, wherein forming said second transistor device comprises forming a second high-k dielectric layer on said semiconductor layer and forming a second gate electrode over said second high-k dielectric layer, said second gate electrode comprising a metal gate layer.

17. The method of claim 15, wherein said first transistor device is an N-channel transistor device and said second transistor device is P-channel transistor device.

18. The method of claim 15, wherein said insulating layer and said control gate layer are formed over said SiGe region and said semiconductor layer in said logic area.

19. The method of claim 13, further comprising forming an erase gate over said semiconductor bulk substrate in said memory area.

20. The method of claim 13, further comprising performing a common processing operation to form a first high-k dielectric layer of said first transistor device and to form a second high-k dielectric layer between said select gate and said control gate and said floating gate.

* * * * *